US008497689B1

(12) United States Patent
Tsironis

(10) Patent No.: US 8,497,689 B1
(45) Date of Patent: Jul. 30, 2013

(54) METHOD FOR REDUCING POWER REQUIREMENTS IN ACTIVE LOAD PULL SYSTEM

(76) Inventor: Christos Tsironis, Kirkland (CA)

( * ) Notice: Subject to any disclaimer, the term of this patent is extended or adjusted under 35 U.S.C. 154(b) by 447 days.

(21) Appl. No.: 12/659,465

(22) Filed: Mar. 10, 2010

(51) Int. Cl.
*G01R 27/04* (2006.01)
*G01R 27/32* (2006.01)

(52) U.S. Cl.
USPC ........... 324/642; 324/655; 324/637; 333/642; 333/263

(58) Field of Classification Search
USPC ............... 324/762.09, 602, 603, 605, 609, 324/612, 615, 637, 655, 642; 333/17.3, 642, 333/263
See application file for complete search history.

(56) References Cited

U.S. PATENT DOCUMENTS

| | | | |
|---|---|---|---|
| 6,297,649 B1 | 10/2001 | Tsironis | |
| 6,509,743 B1 * | 1/2003 | Ferrero | 324/637 |
| 6,639,393 B2 * | 10/2003 | Tasker et al. | 324/76.19 |
| 6,812,714 B2 * | 11/2004 | Verspecht et al. | 324/638 |
| 7,135,941 B1 | 11/2006 | Tsironis | |
| 7,248,866 B1 * | 7/2007 | Tsironis | 455/423 |
| 7,282,926 B1 * | 10/2007 | Verspecht et al. | 324/637 |
| 7,449,893 B1 * | 11/2008 | Tsironis | 324/633 |
| 7,486,067 B2 * | 2/2009 | Bossche | 324/76.22 |
| 2001/0024117 A1 * | 9/2001 | Kiyokawa et al. | 324/76.49 |
| 2004/0119481 A1 * | 6/2004 | Tsironis | 324/637 |
| 2004/0207426 A1 * | 10/2004 | Tsironis | 324/764 |
| 2006/0017530 A1 * | 1/2006 | Boulerne | 333/263 |
| 2006/0139130 A1 * | 6/2006 | Boulerne | 333/263 |
| 2012/0007605 A1 * | 1/2012 | Benedikt | 324/612 |

OTHER PUBLICATIONS

Product Note 79, "MPT, a universal Multi-Purpose Tuner", Focus Microwaves, Oct. 2004.
Datasheet, Xiangyu Communication Technology Co, Ltd, 2007.
"Overcoming Nonlinear Measurement Challenges", Application Note, Tektronix Corp, 2009.
Application Note 6, "Load Pull Measurements on very low impedance transistors", Focus Microwaves, Nov. 1993, Tables 4a, 4b, frequency points: 1, 2, 3GHz.
"A new load-pull characterization method for microwave power transistors", Y.Takayama, 1976 IEEE-MTT-S symposium, pp. 218-220, Jun. 1976.
Cascading Tuners for High-VSWR and Harmonic Load Pull, Note 5C-081, Maury Microwave Corp, 2009.

(Continued)

*Primary Examiner* — Jermele M Hollington
*Assistant Examiner* — Alesa Allgood

(57) ABSTRACT

A method and test setup for reducing the RF power requirement in active load pull uses impedance tuners between the output of the test transistor and the active RF power injection network. The active network uses either a closed loop (active load) configuration or an open loop network employing split or synchronized signal sources. The impedance tuners are wideband (fundamental) tuners, harmonic rejection tuners or multi-harmonic tuners. A 7:1 transforming ratio of the tuners represents the best compromise between power matching and tuner loss, yielding a reduction of 11dB in power requirements from the active load or the synchronized source(s); if only the fundamental signal is injected at the output of the DUT, a multi-harmonic tuner or a harmonic rejection tuner is used for independent harmonic tuning; if multiple harmonic signals are injected, a multi-harmonic tuner is used and creates passive harmonic loads while reducing at the same time the power requirements from the harmonic injection sources.

17 Claims, 21 Drawing Sheets

OTHER PUBLICATIONS

Product Note 42, "Active Modules for harmonic load pull measurements", Focus Microwaves, Apr. 1997.
"Recent technological advances for Modular Active Harmonic Load Pull Measurement Systems", Ferrero et al.
RFS, Diplexer-Triplexer Datasheet.
Wikipedia, "Quarter wave impedance transformer".
"Understanding power splitters", AN-10-006, Mini Circuit Laboratories, Mar. 25, 2005.
"How does a tuner work?", Website, Focus Microwaves Inc, http://www.focus-microwaves.com/template.php?unique=157, 2006.
"Load Pull Tuners are Frequency Selective", Cover Story; Microwaves and RF magazine, Jan. 2004, pp. 97-100.
"MPT, a Multi-Purpose, Vibration-Free Tuner", Product Note 78, Focus Microwaves, Jun. 2004.
"Device Characterization with harmonic source and load pull", application note 5C-044, Maury Microwave, Dec. 7, 2000.
"Harmonic Effects in Load Pull using Wideband Tuners", application note 56, Focus Microwaves, Aug. 2003.
"On Wafer Load Pull of Sub-Ohmic Power Chips", application note 55, Focus Microwaves, Jul. 2003.

* cited by examiner

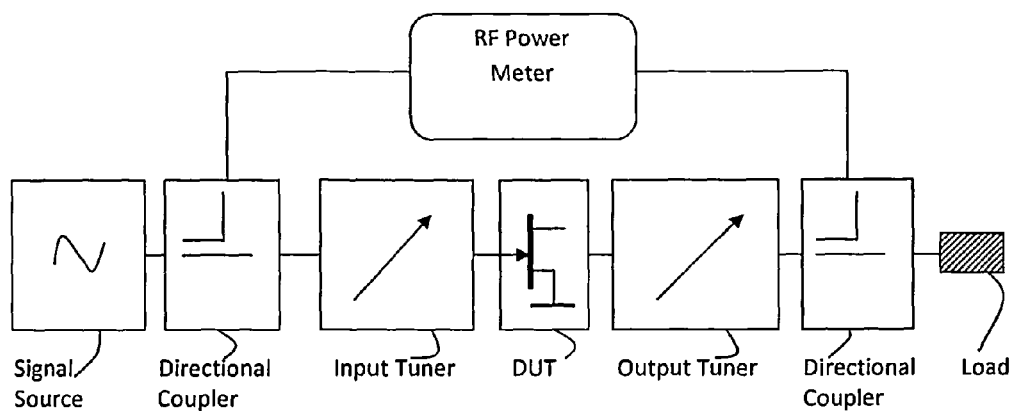
Figure 1a, previous art: load pull test system using passive impedance tuners
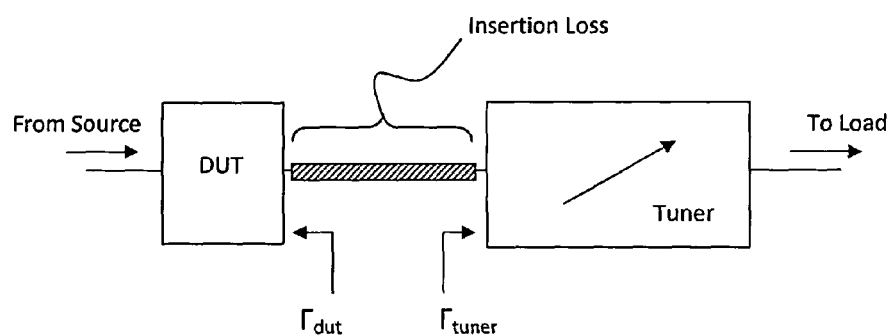
Figure 1b, previous art, insertion loss of RF connection between tuner and DUT

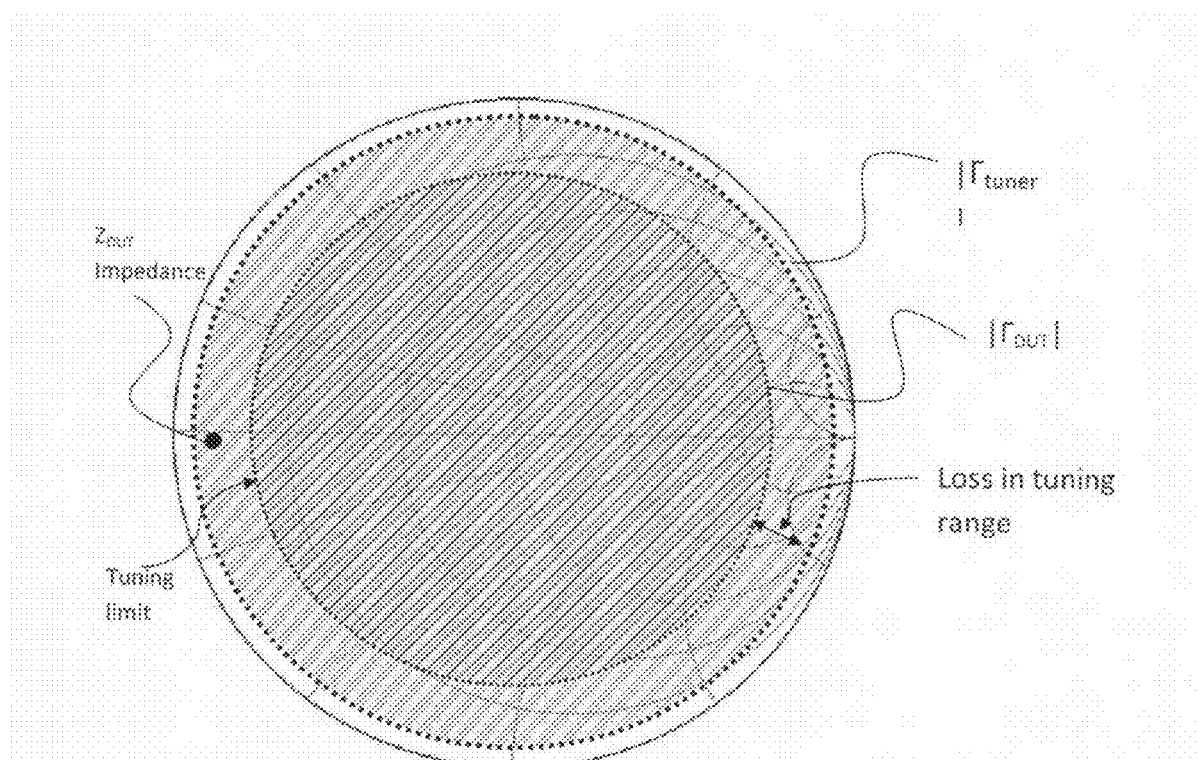
Figure 2: Insertion loss between DUT and tuner reduces the tuning range, thus not allowing measurements at the internal DUT impedance $Z_{DUT}$ ($\Gamma_{DUT}$).

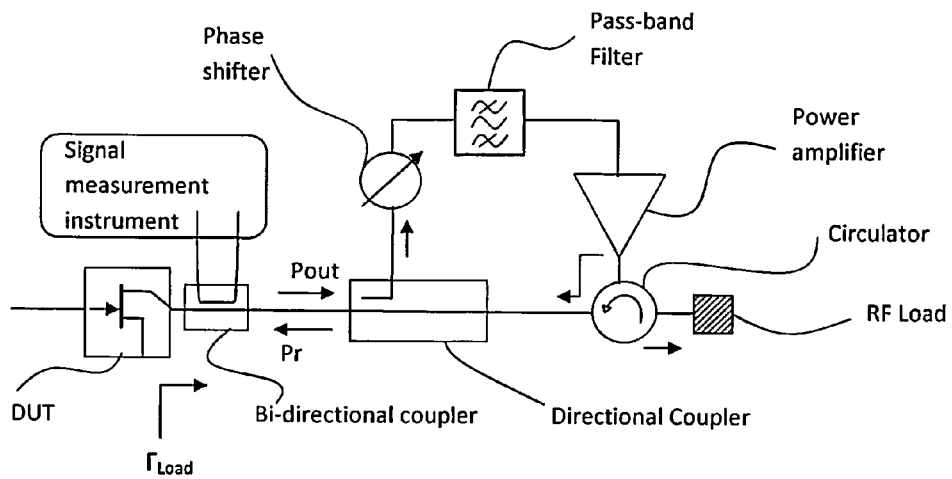
Figure 3: prior art, schematic of "active load" load pull system and reflection factor seen by the DUT: $|\Gamma_{Load}|^2 = Pr / Pout$.

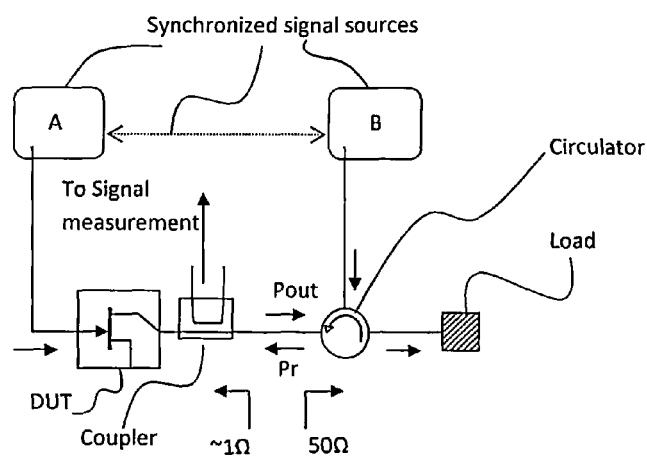
Figure 4: prior art, generating a "virtual" load to a DUT using active power injection into the DUT output from a second source (B), synchronized (coherent) with the primary source (A).

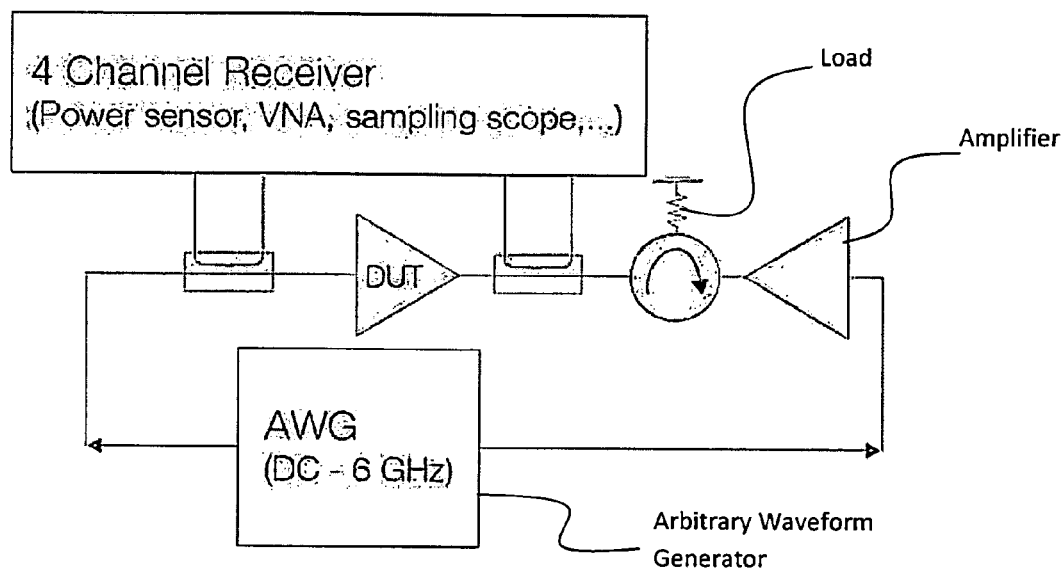
Figure 5, prior art: open loop configuration of active load pull system [6]

a)
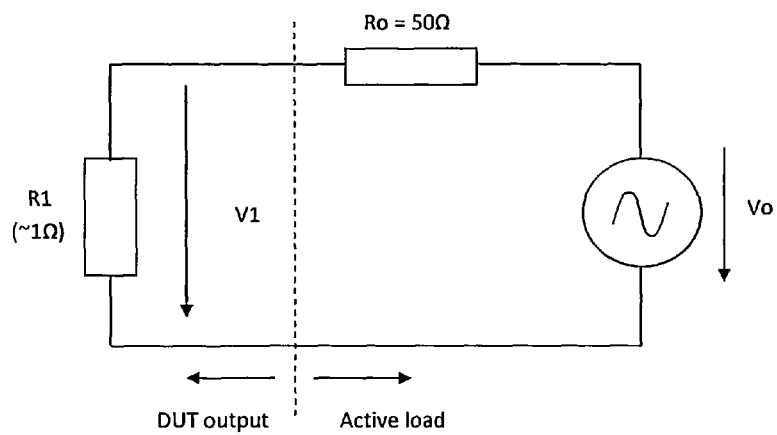
b)
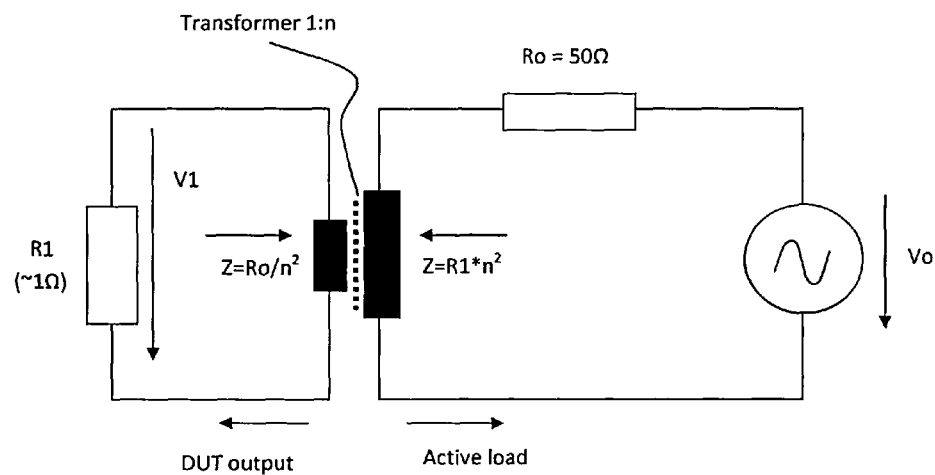
Figure 6a, b: prior art, simplified electrical equivalent circuit of a load pull system using active power injection and a 1:n transforming network.

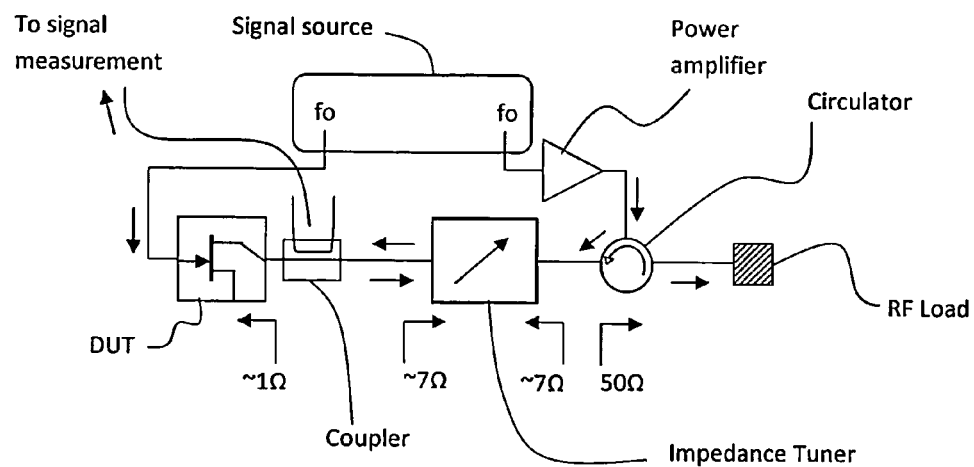
Figure 7: Using a transformer (=impedance tuner) in reducing power requirements of an active injection load pull system.

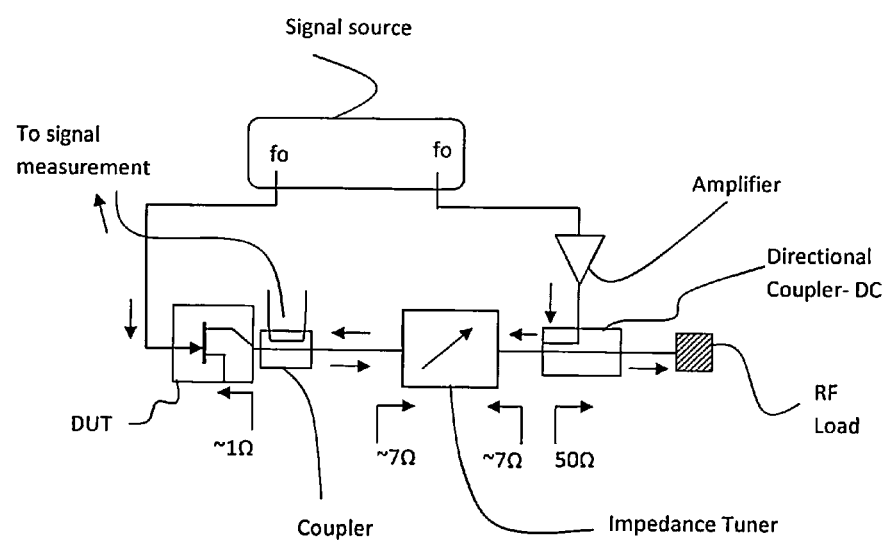
Figure 8: Pre-matched active injection load pull system using a directional coupler instead of a circulator. Directional couplers are more wideband, but introduce "coupling loss" requiring an additional amplifier.

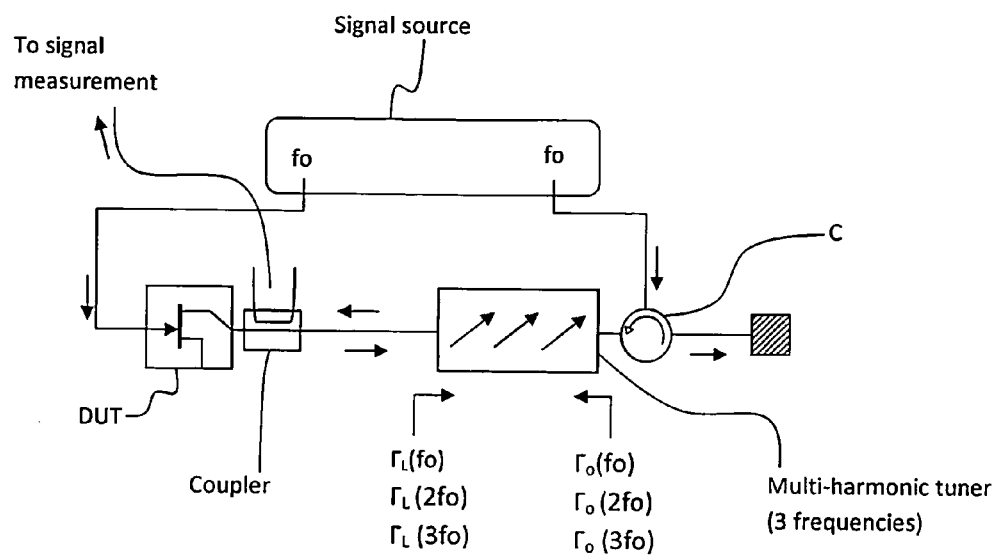
Figure 9: Active load pull with harmonic impedance control using a multi-harmonic tuner.

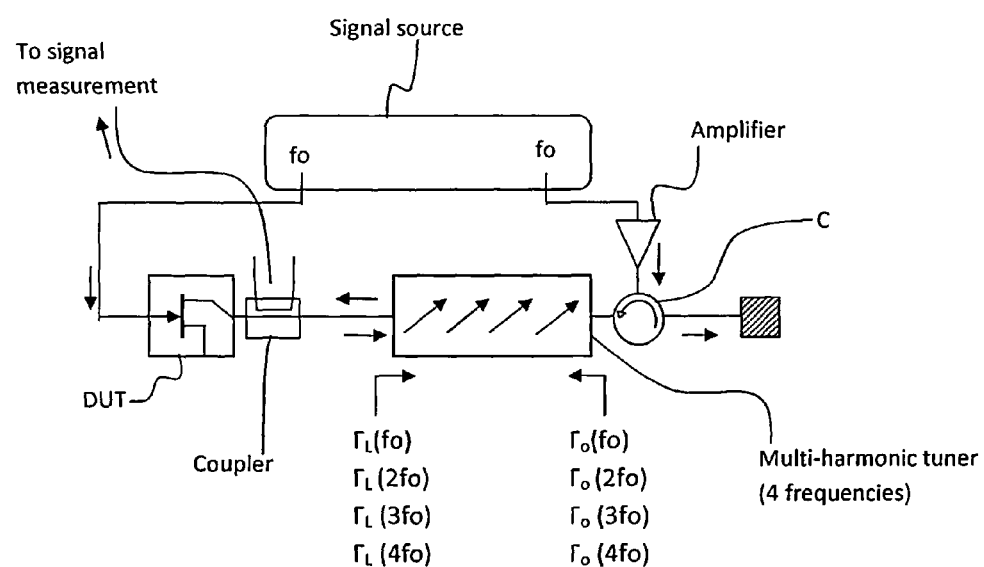
Figure 10: Active load pull with harmonic impedance control using a 4-frequency multi-harmonic tuner.

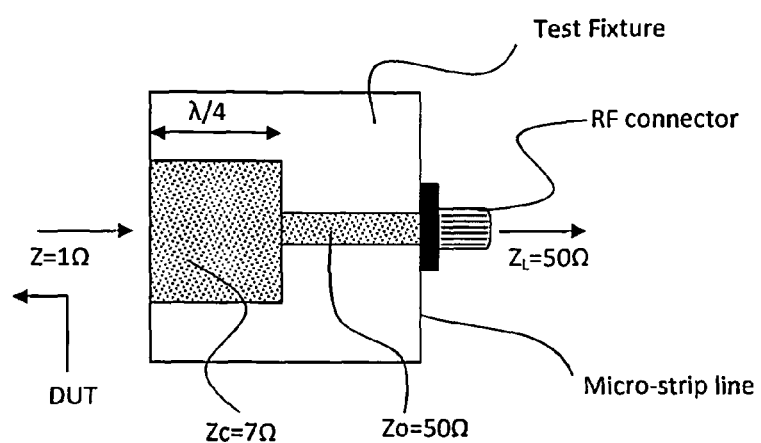
Figure 11: Prior art: Top view of typical "Lambda Quarter" micro-strip transforming test fixture.

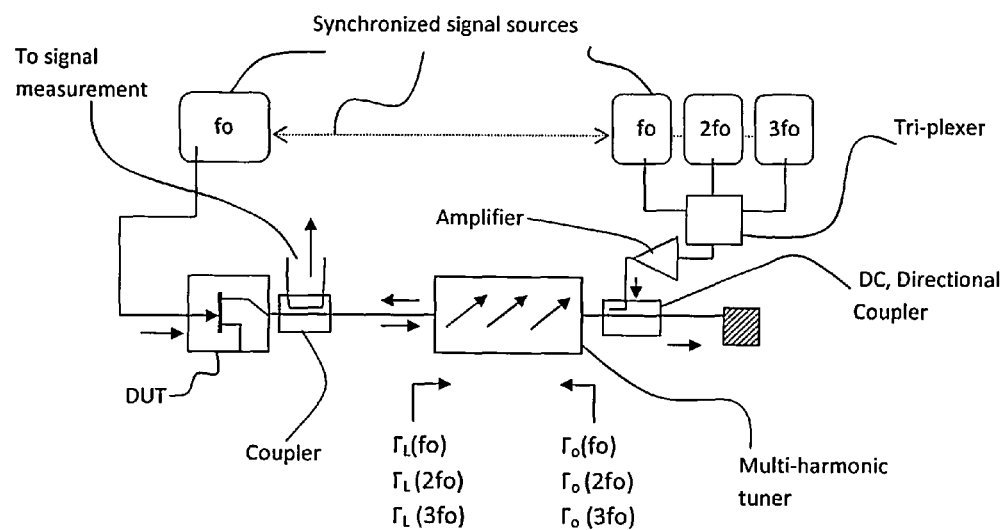
Figure 12: Active harmonic load pull system using synchronized sources, coupler and multi-harmonic tuner.

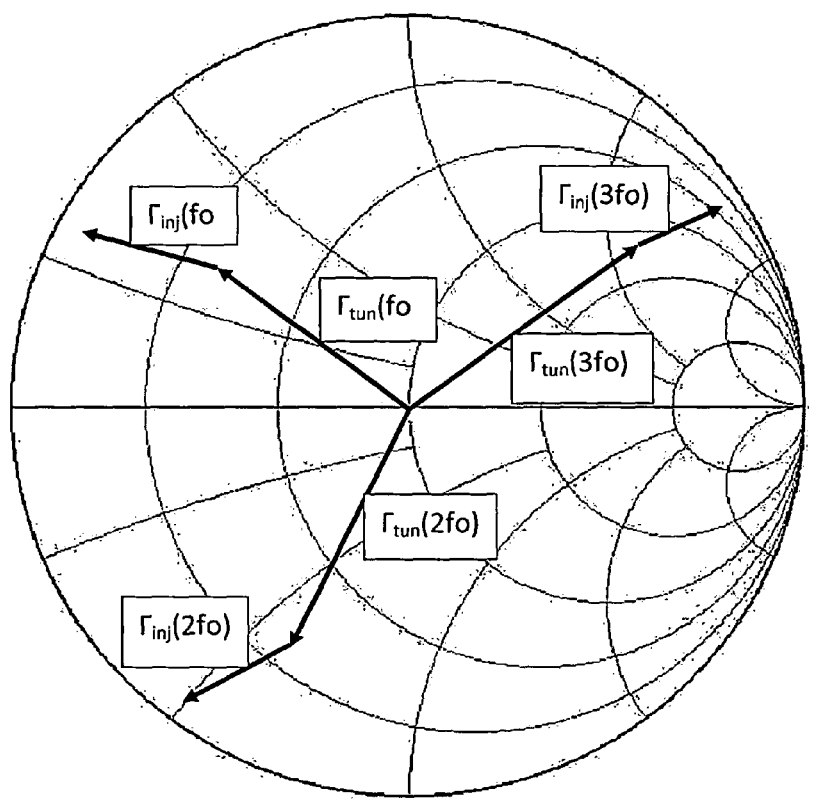
Figure 13: Total reflection at DUT output is the combination of reflection generated by the tuner ($\Gamma_{tun}$) and power injection ($\Gamma_{inj}$).

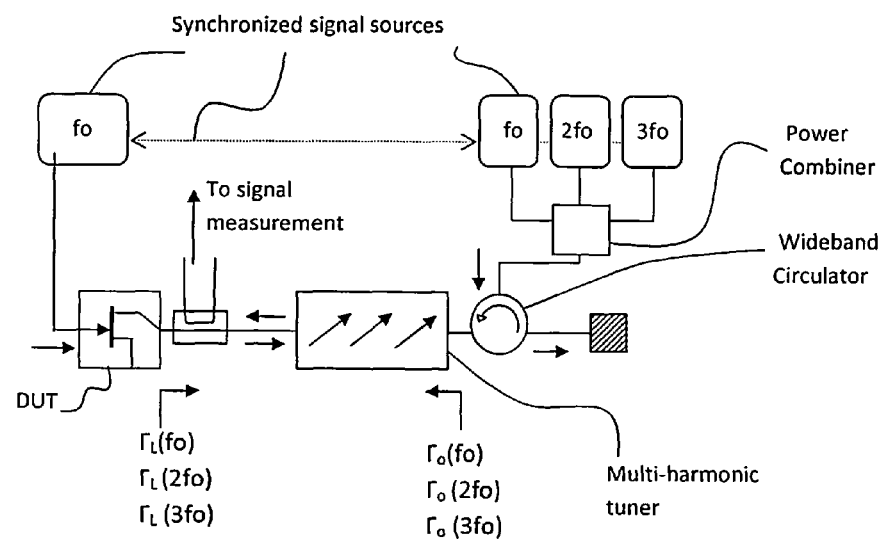
Figure 14: Active harmonic load pull system using synchronized sources, wideband circulator and multi-harmonic tuner.

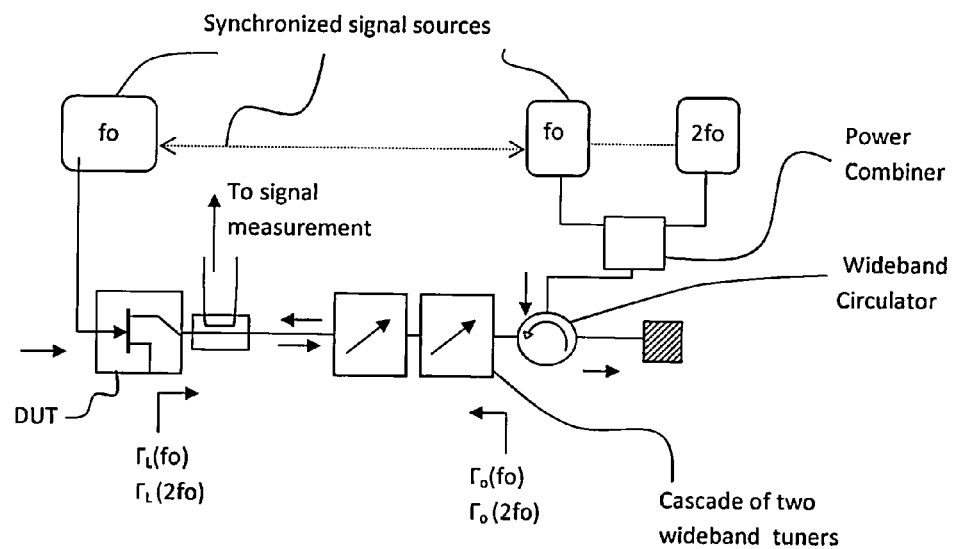
Figure 15: Active harmonic load pull system using two cascaded tuners.

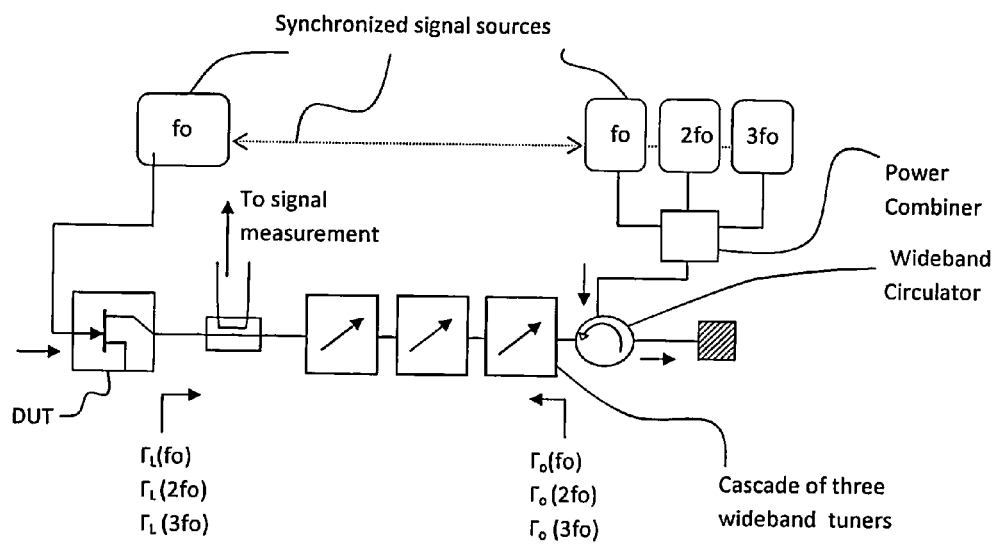
Figure 16: Active harmonic load pull system using three cascaded tuners to create and control impedances and pre-match power flow at the fundamental and two harmonic frequencies.

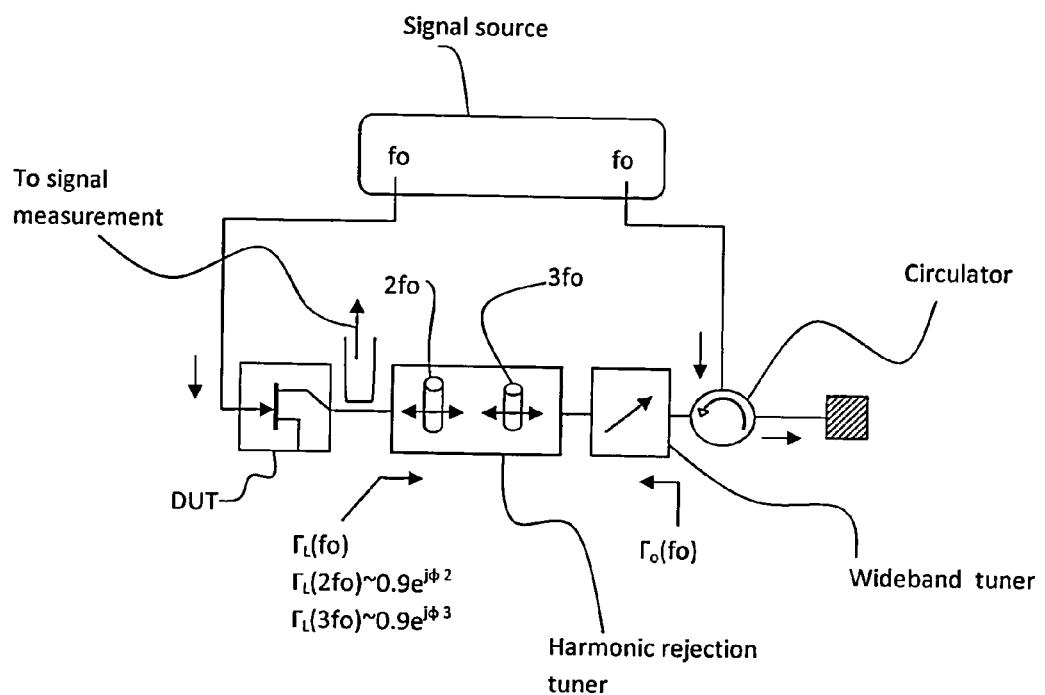
Figure 17: Active load pull system using a harmonic rejection tuner and a wideband tuner.

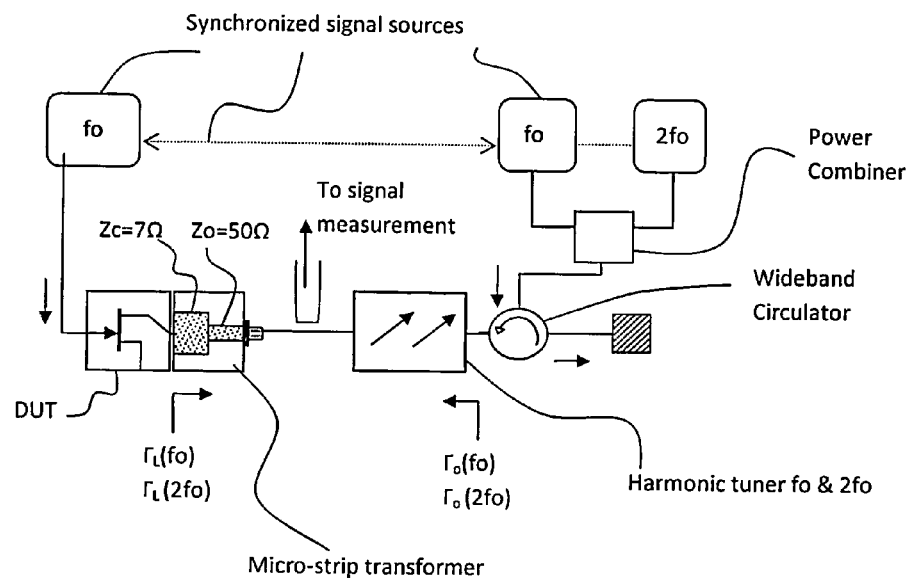
Figure 18: active harmonic system using lambda quarter transformer for fundamental (fo) prematching and harmonic tuner for fo and 2fo tuning.

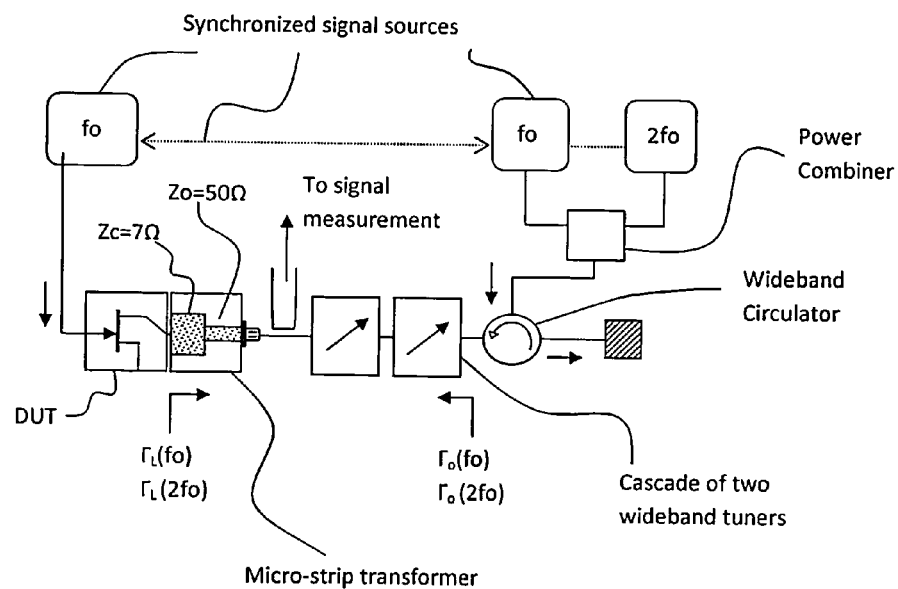
Figure 19: Active harmonic system using lambda quarter transformer for fo prematching and cascade of two wideband tuners for fo and 2fo tuning.

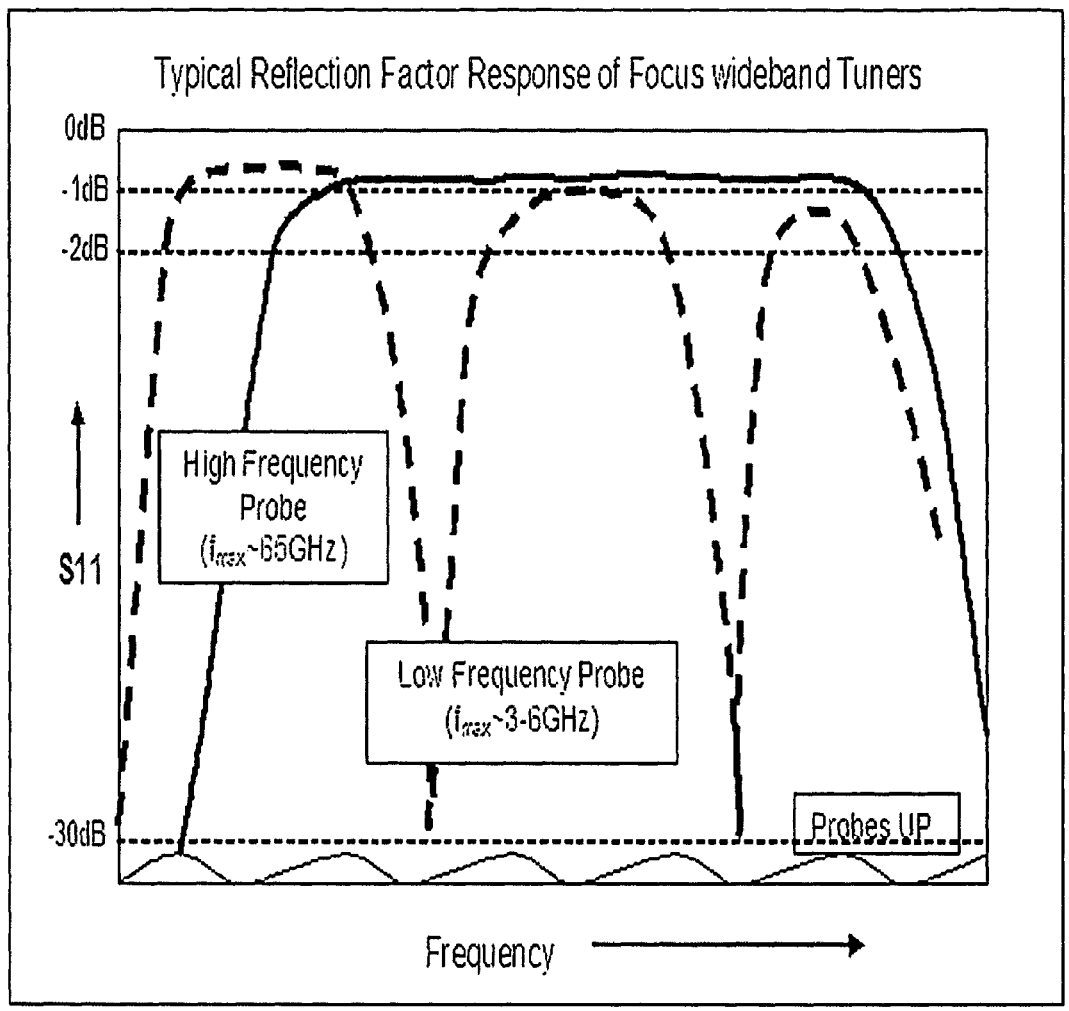
Figure 20: Typical reflection factor of wideband tuners

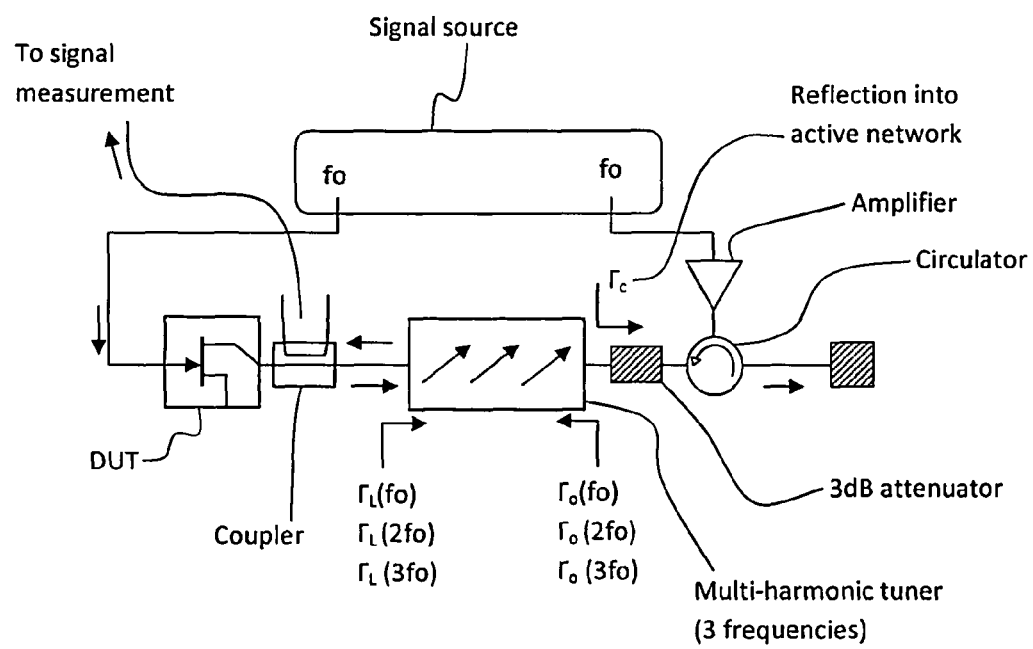
Figure 21: 3dB attenuator improves load reflection factor $\Gamma_c$

METHOD FOR REDUCING POWER REQUIREMENTS IN ACTIVE LOAD PULL SYSTEM

PRIORITY CLAIM

Not applicable

CROSS-REFERENCE TO RELATED ARTICLES

[1] Product Note 42, "Active Modules for harmonic load pull measurements", Focus Microwaves, April 1997
[2] U.S. Pat. No. 7,135,941, Triple probe automatic slide screw load pull tuner and method.
[3] U.S. Pat. No. 6,297,649, Harmonic rejection load tuner.
[4] Product Note 79, "MPT, a universal Multi-Purpose Tuner", Focus Microwaves, October 2004.
[5] Datasheet, XIANGYU COMMUNICATION TECHNOLOGY CO, LTD.
[6] "Overcoming Nonlinear Measurement Challenges", Application Note, Tektronix Corp.
[7] Application Note 6, "Load Pull Measurements on very low impedance transistors", Focus Microwaves, November 1993, Tables 4a, 4b, frequency points: 1, 2, 3 GHz.
[8] "A new load-pull characterization method for microwave power transistors", Y. Takayama, 1976 IEEE-MTT-S symposium, pp. 218-220, June 1976.
[9] Cascading Tuners For High-VSWR And Harmonic Load Pull, Note 5C-081, Maury Microwave Corp.
[10] "Recent technological advances for high-VSWR and harmonic load pull", Ferrero et al.
[11] RFS, Diplexer-Triplexer Datasheet.
[12] Wikipedia, "Quarter wave impedance transformer".
[13] "Understanding power splitters", AN-10-006, Mini Circuit Laboratories
[14] "How does a tuner work?", Website, Focus Microwaves Inc, http://www.focus-microwaves.com/template.php?unique=157
[15] Harmonic Impedance Tuner with four wideband probes and method; U.S. patent application Ser. No. 12/457,187; Jun. 3, 2009

STATEMENT REGARDING FEDERALLY SPONSORED RESEARCH OR DEVELOPEMENT

Not applicable

REFERENCE TO SEQUENCE LISTING, A TABLE, OR A COMPUTER PROGRAM LISTING COMPACT DISC APPENDIX

Not applicable

BACKGROUND OF THE INVENTION

This invention relates to microwave load pull testing of transistors and other active devices using impedance tuners.

Modern design of high power microwave amplifiers and oscillators, used in various communication systems, requires accurate knowledge of the active device's (microwave transistor, DUT) characteristics. In such circuits, it is insufficient for the transistors, which operate in their highly non-linear regime, close to power saturation, to be described using non-linear numeric models.

A popular method for testing and characterizing such microwave components (transistors) in the non-linear region of operation is "load pull". Load pull is a measurement technique which allows changing the impedance seen by the DUT in a controlled manner, in order to explore the DUT's performance under such impedance conditions and find the optimum environment conditions for certain performance goals. One widespread technique employs passive microwave impedance tuners and other microwave test equipment for this task; said microwave tuners are used in order to reflect part of the outgoing power from the DUT and thus manipulate the microwave impedance conditions under which the Device Under Test (DUT, or transistor) is tested (FIG. 1).

DESCRIPTION OF PRIOR ART

Passive impedance tuners can reach reflection factors $|\Gamma_{tuner}|$ of the order of 0.95, corresponding to impedances of 2.4Ω. The insertion loss between DUT and tuner reduces the available tuning range at the DUT reference plane. This is shown in FIGS. 2 and 3. Consequently, load pull systems using passive impedance tuners have tuning range limitations. In order to compensate for said limitations "active" techniques have been proposed, in which RF power is, artificially, injected into the DUT in order to replace the power simply reflected at a passive load.

Such load pull techniques use the so called "virtual load" method. The virtual load method consists in injecting into the output of the DUT RF power at the same frequency as traversing the DUT from the input to the output, but with controlled phase and amplitude. Knowing that the reflection factor "seen" by the DUT is equal to the ratio of returned (normally "reflected") power wave (Pr) to primary output power wave (Pout): ($|\Gamma|$=sqrt (Pr/Pout)), it is understood that by controlling the phase and amplitude of Pr we can control Γ. There are a number of ways to do this [10]: One is to use an "active load" technique (FIG. 4). In this case part of the outgoing power Pout is split into a directional coupler, filtered, phase adjusted and amplified and re-injected into the output port of the DUT, which will "see" a complex load Γ as described above. Another method is to use a split signal [8] or two synchronized RF sources or one split source [6], one to inject RF power into the input of the DUT and one into its output (FIG. 5). Since the sources are synchronized they can generate a coherent signal and if we adjust the relative phases between sources and the amplitude of the second source, then the DUT will, again, see at its output port a "virtual" load Γ, as described earlier.

The alternative open loop active load pull approach to nonlinear measurements in FIG. 5 uses different signal sources to inject power into either the source or load side of the DUT. The open loop system absorbs the signal that is generated by the device under test (DUT) and injects back into the device a signal that is generated by an independent coherent but amplitude and phase modulated source. The power amplifier bandwidth should be sufficiently large to cover all harmonic frequencies at which the impedance control is required. Because of high linearity requirements it is often necessary (at higher power levels) to implement the amplification over the required number of harmonics through use of several narrowband power amplifiers operating at center frequencies around the fundamental and harmonic frequencies.

As the state of the art stands today, it is claimed that in both cases of "active signal injection" there is no need for an impedance tuner in order to manipulate the impedance (reflection factor) presented to the DUT. Since the re-injected power Pr can be amplified to levels equal (or even exceeding) Pout, the reflection factor presented to the DUT can be equal to (or even higher than) 1. Of course it does not make sense presenting |Γ|>1 to the DUT, since |Γ|>1 corresponds to a negative real part R of the complex impedance Z=R+jX, and it would be impossible to deliver RF power into a negative resistance. Getting very close to |Γ|=1 is, however, an attractive goal, since the internal impedance of power transistors R1 is very close to (or even lower than) 1Ω. For impedances with zero imaginary parts (an often encountered situation) the simple relation |Γ|=(50Ω−R1)/(50Ω+R1) can be used. If the output impedance of the DUT is R1=1Ω, then the corresponding reflection factor Γ=0.96 (FIG. 6).

BRIEF DESCRIPTION OF THE SEVERAL VIEWS OF THE DRAWINGS

The invention and its mode of operation will be more clearly understood from the following detailed description when read with the appended drawings in which:

FIG. 1a depicts prior art: a wideband load pull test system for testing transistors using passive wideband tuners. FIG. 1b depicts prior art: the position in the setup where insertion loss affects the reflection factor of the tuner, seen by the DUT.

FIG. 2 depicts prior art: the effect of insertion loss of the section between tuner and DUT on the effective tuning range of the tuner.

FIG. 3 depicts prior art: an "active loop" load pull test system, where a sample of the outgoing signal is amplified and phase adjusted to be re-injected into the output of the DUT.

FIG. 4 depicts prior art: an active injection load pull test system using direct injection from two synchronized sources at the same fundamental frequency using a 50 ohm circulator.

FIG. 5 depicts prior art: a commercial load pull test system [6] using an injection arbitrary waveform source with the signal split between the input and output of the DUT, again using a 50 ohm circulator.

FIGS. 6 a, b depict prior art, showing the concept of injecting power from a generator into a mismatched load and the effect of a transformer.

FIG. 7 depicts prior art: an active fundamental frequency (fo) load pull test setup, where a second signal source generates a signal at fo which is injected into the output of the DUT and uses a 50 ohm circulator and a passive (wideband) impedance tuner for reducing the power requirement of the injection power amplifier.

FIG. 8 depicts the same, prior art, setup as FIG. 7, except the circulator is replaced by a directional coupler (DC) in order to inject the signal from source 2 into the DUT.

FIG. 9 depicts a new hybrid active injection load pull system using a second coherent source and a passive harmonic tuner, wherein tuning with the harmonic tuner at the fundamental frequency (fo) pre-matches the fundamental impedance and reduces injected power, and, simultaneously, tuning at the harmonic frequencies (2fo) and (3fo) is created using passive harmonic tuning only.

FIG. 10 depicts a setup as in FIG. 9, except active injection tuning, using passive pre-matching, is at the fundamental frequency (fo) and passive tuning at three harmonic frequencies (2fo, 3fo and 4fo) using a four probe harmonic tuner [15].

FIG. 11 depicts prior art: output section of pre-matching test fixture using a Lambda/4 micro-strip transformer with a characteristic impedance Zc<Zo.

FIG. 12 depicts a hybrid active injection harmonic load pull test setup using three coherent signal sources injecting power at the DUT output at the fundamental (fo) and two harmonic frequencies (2fo, 3fo), and a harmonic tuner used to pre- match all frequencies (fo, 2fo and 3fo) in order to reduce injected power at all frequencies.

FIG. 13 shows the mechanism of passive pre-matching at 3 harmonic frequencies simultaneously (hybrid harmonic tuning), whereby $\Gamma_{tun}$(nfo) is the passive reflection factor generated by the harmonic tuner and $\Gamma_{inj}$(nfo) is the reflection factor created by active power injection.

FIG. 14 depicts a hybrid system like in FIG. 12, wherein the output power amplifier is not included.

FIG. 15 depicts a hybrid system like FIG. 12, wherein only two injection sources are used and the harmonic tuner is replaced by a cascade of two wideband tuners, which has the capacity to perform harmonic tuning at two frequencies.

FIG. 16 depicts a hybrid setup as in FIG. 12 wherein the harmonic tuner is replaced by a cascade of three wideband tuners which has the capacity to perform harmonic tuning at three frequencies.

FIG. 17 depicts a hybrid setup, wherein a single output injection source and a wideband tuner are used to pre-match at the fundamental frequency (fo) and wherein a passive harmonic rejection tuner [3] is used to generate high reflection at the second and third harmonic frequencies.

FIG. 18 depicts a hybrid harmonic load pull test setup, wherein the DUT is pre-adapted by mounting in a pre-matching test fixture, which uses a lambda/4 transformer, and a two frequency harmonic tuner is used to pre-match the fundamental and first harmonic frequencies (fo, 2fo), injected into the DUT output from two coherent injection sources.

FIG. 19 depicts a hybrid setup wherein a cascade of two wideband tuners is used to pre-match an already pre-adapted DUT in a test fixture which uses a lambda/4 transformer.

FIG. 20 depicts the typical frequency response of the various types of probes used in wideband slide screw tuners.

FIG. 21 depicts a harmonic hybrid setup, wherein a (typically) 3 dB attenuator is used to reduce the residual reflection of a wideband circulator outside its operation band, without increasing dramatically the requirement for injected power.

DETAILED DESCRIPTION OF THE INVENTION

The present invention is about reducing the power requirements in the circuit of the active power injection into the DUT. As already shown an active injection system, consisting of an "active loop" or "two sources", uses a (typically) 50Ω generator (the circulator in FIG. 3 or the directional coupler in FIG. 8 are both components with 50Ω internal impedance) to inject RF power into the output port of the DUT, which is a low value impedance of typically 0.5 to 2Ω. FIG. 6 illustrates the base of the power transfer calculations. In case of FIG. 6a (no transformer) the power delivered from the source Vo to the load R1 is: $P1=Vo^2*R1/(R1-Ro)^2$. In the case of FIG. 6b (transformer 1:n included) the power delivered from the source Vo to R1 is: $P1=Vo^2*n^2*R1/(Ro-n^2*R1)^2$. The ratio of power delivered to R1 directly or through a transformer is then: P1(direct)/P1 (transformed)=$(Ro+n^2*R1)^2/(n^2*(R1-Ro)^2)$. In a typical case of R1=1Ω, Ro=50Ω, n=7, this ratio becomes: P1.direct/P1.transf=1/13=0.077. In short, adding a 7:1 transformer reduces the power requirement by a factor of 13 (=11.14 dB). If R1=0.55, and with a transforming ratio of 10:1, the power ratio becomes: P1.direct/P1.transf=1/25=0.04 (the power needed becomes 25 times less, or 14 dB). These are very important savings in power requirement from the RF power amplifiers, since said amplifiers need to operate under very linear conditions in order not to create spurious signals in the measurement.

Transformers, including impedance tuners, are not lossless. Depending on the transforming ratio the loss own to the transformer may be significant up to a level in fact canceling the power transfer gain obtained due to their use. Typically microwave transformers have loss of the order of 0.1 to 3 dB, depending on their manufacturing procedure, frequency and transforming ratio, up to transforming ratios of 10:1. Microstrip, fixed, transformers (FIG. 11) have low loss, of the order of 0.5-2 dB, again for typical transforming ratios up to 10:1. Impedance tuners, as proposed here, have loss between 0.5 and 2 dB depending on frequency and transforming ratio. At 2 GHz a 7:1 impedance transformer has less than 0.5 dB loss. This does not reduce significantly the advantage in power transfer gained by using said transformers in this application.

High power transistors are operated in their nonlinear regime, close to saturation. This is required in order to increase amplifier efficiency and battery life in mobile equipment, like mobile phones. Under these conditions the transistors generate harmonic signals. If said harmonic signals are not properly terminated at the output of the DUT, the efficiency and linearity of the amplifiers degrades. Thus the necessity of controlling the harmonic impedances at the output of the DUT as well as the main (fundamental) frequency (fo). Harmonic frequencies are named here as $2fo$, $3fo$ etc. The corresponding impedances are $Z(2fo)$, $Z(3fo)$, etc. (or reflection factors $\Gamma(2fo)$, $\Gamma(3fo)$ etc.); noticing that $\Gamma=(Z-Zo)/(Z+Zo)$, with $Z=R+jX$ being the complex impedance and $Zo=50\Omega$ the typical characteristic impedance of microwave networks. Harmonic impedance control is possible using appropriate harmonic tuners [PHT, MPT patents and literature].

FIGS. 9, 10, 12 and 14 to 19 show various possible configurations of active load pull test systems with harmonic impedance control. At each frequency present at the output of the DUT (fo, $2fo$, $3fo$ etc.) it is possible to create a "real", a "virtual" or a "combination" load impedance either using active injection from an external source or a real load using an impedance tuner or both (FIG. 13). In FIG. 13 the individual reflection factors at each harmonic frequency are shown to be the vector sum of a primary reflection factor $\Gamma_{tun}$ coming from the impedance tuner and a secondary reflection factor $\Gamma_{inj}$ coming from the external signal source through active injection network. The choice of method depends on the frequency (fo) itself and the characteristics of certain components, such as the circulator C (FIG. 10) [5]. Circulators covering a full range of three harmonic frequencies are rare. They exist covering bandwidths between 2 and 6 GHz or 6 and 18 GHz, but no more. So, active injection must in certain cases be provided by a wideband coupler, such as a 3 dB coupler, DC, FIG. 8). In this case the loss in power at the output is 3 dB (=half of the injected power reaches the DUT), but the gain in power transfer efficiency due to the transformer, in general, over-compensates for that.

Using multi-harmonic passive tuners [2, 15] in a load pull setup offers important advantages when seeking full harmonic impedance control: a) the harmonic impedances can be controlled, directly at the output of the DUT using said (passive) tuner. Only RF power at the fundamental frequency (fo) needs to be actively injected by the second source, FIG. 9 (or the active loop, FIG. 3), in which case the limited bandwidth of a circulator is not really a handicap. On the contrary, circulators having insertion loss of 0.5 dB or less [5] are clearly superior to wideband 3 dB couplers (which have 3 dB loss). The configuration of FIG. 9 is then a superior solution to the configuration of FIG. 12; the fact that insertion loss between DUT and tuner (FIGS. 1b, 2) reduces the tuning range at the harmonic frequencies as well, is of lesser importance, since harmonic tuning has anyway a non-negligible but nevertheless secondary effect on DUT performance.

In case of FIG. 12, a wideband coupler is used, through which harmonic signals are injected in order to enhance harmonic tuning range at the DUT port, despite the coupler's at least 3 dB insertion loss, the multi-harmonic tuner can still be useful in pre-matching the high output impedance of the DUT to the 50$\Omega$ internal impedance of the coupler, as can be understood by comparing with FIG. 13.

So, either using active injection at the harmonics or not, a multi-harmonic tuner, allowing independent pre-matching between the DUT and the active load brings advantages in reducing the RF power required from said sources associated with the active load. Said RF power is provided by complex and costly power amplifiers, which can be downsized. In certain (higher) frequency ranges, such as fo=10 GHz (corresponding to harmonic frequencies $2fo$=20 GHz and $3fo$=30 GHz) said power amplifiers are rare, unstable and very expensive. The associated networks become cumbersome and sensitive. Such solutions are so impractical that, even if theoretically possible, they are rarely employed. The test setups proposed here have key advantages, in that they are stable, cost effective and easy to calibrate and operate.

Harmonic tuning using wideband multi-harmonic tuners consists in searching for simultaneous impedance solutions at the harmonic frequencies among a large amount of possible alternatives [4]. The load impedance $\Gamma_c$ at the output of said tuners affects the capacity of tuning at the DUT output ($\Gamma_L$) all over the Smith chart (FIG. 21). Circulators have a very low reflection factor inside their operation bandwidth, but have important reflection outside of it. In this case the load reflection factor $\Gamma_c$ presented to said harmonic tuner must be reduced into a manageable level over the whole frequency bandwidth; this can be done using a moderate size passive attenuator; FIG. 21 shows the use of a 3 dB attenuator. 3 dB is a good compromise, because it reduces the reflection factor by 6 dB (3 dB in each direction) but the reverse injected power at the fundamental frequency (fo) by only 3 dB. If for instance the circulator has a high reflection factor of 0.6 (Return Loss=–4.44 dB) outside its operation band and is damped by a 3 dB attenuator, then said harmonic tuner will "see" a residual reflection reduced by 6 dB: $\Gamma c$=0.3 (=–10.5 dB), which will allow proper harmonic tuning over most of the Smith chart at the DUT output reference plane. If 3 dB is insufficient for adequate harmonic tuning, then higher attenuation can be used, knowing that this will increase the need for higher power from the source and the associated amplifiers.

A simpler (and cheaper) alternative would be, of course, to use a micro-strip transformer (FIG. 11). Such a transformer can be designed to adapt, with little loss, high impedance to low impedance. In the example of FIG. 11, said micro-strip transformer has a quarter lambda long section with a characteristic impedance $Zc$ of 7$\Omega$. A basic formula [12] states that the impedance seen on both sides of such a transformer follows the rule: $Zc^2=Zo*Z1$. With $Zc$=7$\Omega$ and $Zo$=50$\Omega$, then the impedance seen into the transformer by the DUT is $Z1\approx1\Omega$. This means the DUT will be quasi power matched. The disadvantages of fixed micro-strip transformers, beyond the fact that they cannot be used for on-wafer testing, is a limited bandwidth and the fact that they will also transform the odd harmonic impedances ($Z(3fo)$, $Z(5fo)$, etc.) into the same basic area of the Smith chart as the fundamental impedance $Z(fo)$; this is because $\lambda/4$, $3\lambda/4$, $5\lambda/4$ etc. sections of transmission line turn the angle of the reflection factor by 180 degrees, thus transforming a high impedance into a low impedance, whereas sections of $\lambda/2$, $\lambda$, $3/2\lambda$, etc. turn the angle of the reflection factor by 360 degrees, thus maintaining the impedance level as before the transformation [7]; in reference [7] tables 4a and 4b show measured s-parameters in amplitude and angle format (|S11|<S11|S12|<S12|S21|<S21|S22|<S22) of the input and output block of a test fixture, each having a quarter lambda micro-strip transformer, centered at fo=1 GHz, on it; the s-parameters of said sections at fo=1.00 GHz, 2fo=2.00 GHz and 3fo=3.00 GHz show that at fo (1.00 GHz) and 3fo (3.00 GHz) the reflection (|S11|, |S22|) of each said block is high (~0.65 to 0.7) and at 2fo (2.00 GHz) it is low (0.047); this proves the above claim that a lambda quarter transformer is "transparent" at 2fo and by extrapolation 4fo, 6fo etc. and creates high reflection at odd harmonic multiples (3fo, 5fo etc.). The optimal harmonic impedances at the odd harmonic frequencies is not the same as at the fundamental frequency and therefore tuning capability in a different area of the Smith chart is irrevocably reduced. In summary lambda quarter transformers are transparent (albeit with some insertion loss) for even harmonic frequencies in which case the impedances at those frequencies (Z(2fo), Z(4fo), etc. see reference [6]) can be tuned with small disturbance through the lambda quarter transformer, by power injection or multi-harmonic tuner, but with no other advantage (FIG. 18).

FIGS. 14 and 16 show the configuration where three synchronized sources are used to inject harmonic power into the transistor output. Harmonic power generated by the transistor is, in general, lower than the fundamental power, except in cases of extreme nonlinearities. Normally harmonic power is 10 to 20 dB lower than the fundamental signal. Therefore the injected power to be provided from the synchronized sources is also lower. The fundamental and harmonic signals are injected through a wideband directional coupler (DC). The multi-harmonic tuner facilitates the power transfer from the coupler port to the DUT port. In terms of reflection factor this can be seen as "assisted" reflection factor (FIG. 13). It is an efficient way to increase the actual reflection factor at the DUT output port.

The signals generated by the two or three synchronized sources at the output of the test setup must be combined and injected into the output port of the DUT. An efficient way to do this is using a frequency multi-plexer, a Triplexer [11] in case of three frequencies (FIG. 12) or a Diplexer in case of two frequencies [11]. In case of only two frequencies (fo and 2fo) the requirements on the circulator as well as the pre-matching harmonic tuner are simpler. Circulators with an octave bandwidth are easier to have and impedance tuners with two instead of three independent probes can be used.

Frequency multi-plexers (Di- and Tri-plexers, [11]) are frequency selective and have limitations regarding RF power. An alternative is to use simple wideband power combiners (FIGS. 14, 15, 16), [13], with an associated wideband circulator or directional coupler. In each case the insertion loss is different, but limitations in circulator bandwidth [5] may impose the use of wideband directional couplers.

Harmonic tuning using impedance tuners is possible, as mentioned before, using either multi-probe impedance tuners which comprise two or more wideband probes in the same low loss transmission line [2, 4]. Using a cascade of two or more independent wideband tuners can achieve the same result, albeit with lower reflection factor and accuracy performance, due to insertion loss in each cascaded tuner and mismatch loss of each tuner's adapters [9]. Such configurations are shown in FIGS. 15, 16 and 19.

In the setup of FIG. 15 the two cascaded wideband tuners can be selected such as to have a low pass behavior allowing the fundamental frequency (fo) to pass through unaffected and create reflection only for frequencies in the range of the harmonics (2fo and 3fo). This can be done by proper selection of the tuner probes [14], FIG. 20. In this case said cascaded tuners can create harmonic impedances only at 2fo and 3fo and allow active power injection pass through to the DUT. This configuration is recommended when the bandwidth of the circulator is insufficient to handle the harmonics, as is the case for fundamental frequencies below 2 GHz [5].

Another method consists in using harmonic rejection tuners [3], FIG. 17; harmonic rejection tuners use narrow-band resonator heads and generate high reflection at the harmonic frequencies, without the capability of adjusting the amplitude of the reflection factor. Therefore said harmonic rejection tuners are not suitable for pre-matching the harmonic signals coming from the active load, which in this case injects only fundamental RF power and not harmonic signals. Said harmonic rejection tuners create only high reflection factors with phase control at the harmonic frequencies but allow the fundamental signal power (which is the more critical one) to traverse with very little insertion loss; said fundamental power is traversing from the active load and is pre-matched by an additional wideband tuner, which is inserted between the output of the harmonic rejection tuner and the circulator.

It has been found that the ratio of tuner loss versus improvement of power transfer degrades significantly for transforming ratios larger than 10:1. This means that, when an impedance tuner is used to pre-match the active load source(s) the recommended transforming ratio is ~7:1. At this level the tuner loss is low and improvement of RF power transfer is high. The typical overall gain in power transfer exceeds 10 dB (a factor of 10 in RF power), which is very significant: the cost of a 100 Watt amplifier (when available) can be 5 to 10 times higher than that of a 10 Watt amplifier. In order to match the RF power delivered by a power transistor (meaning to generate a reflection factor close to 1) we need to inject into its output port almost as much power as the transistor itself generates. A (typical) 10 Watt transistor would need, if pre-matching is used roughly a 15 Watt amplifier, assuming typical insertion and coupling losses in the injection path; the same transistor would require a 150 Watt amplifier if RF power is injected directly, without pre-matching. The same reasoning exists at the harmonic frequencies, albeit the powers involved are typically 10 to 20 dB (=10 to 100 times) lower, but the frequencies are also higher and so is the cost of the corresponding amplifiers.

The concept of using impedance tuners, partly combined with fixed matching networks, in order to improve the RF power transfer and reduce power requirements of an active injection network into the output port of a power transistor in a load pull system can be materialized in a number of possible ways; several such configurations with practical significance have been outlined in this invention; this shall not limit the claims to obvious combinations and variations of this basic concept.

What I claim as my invention is:

1. An active injection harmonic load pull test setup for reduced injected power comprises a signal source with two coherent output channels, independently adjustable in amplitude and phase, a device under test (DUT), a signal sampler, a source tuner and a load multi-probe harmonic tuner, a circulator, a microwave load and a signal receiver;

wherein the signal from the first channel of said signal source is injected through the source tuner into the input port of said DUT and the signal exiting from the output port of the DUT is injected into the input port of said signal sampler;

said signal sampler being a four-port RF component, having an input and an output port and two coupled ports which sample, in a contactless manner, a small portion of the forward and backward travelling signal power waves between said input and output ports;

said signal sampler being operational at least over the frequency range between an operation frequency (fo) and the third harmonic frequency (3fo);

and wherein a small portion of the signal is sampled by said signal sampler and injected into said signal receiver;

and wherein the remaining signal at the output of said signal sampler is injected into the input port of said harmonic tuner;

said harmonic tuner having an input port and an output port and a slotted airline (slabline) connecting said ports and two or more metallic probes (slugs) capacitively coupled to the center conductor of said slabline, said probes being insertable into said slabline and moveable by remote control vertically approaching said center conductor of said slabline and horizontally parallel to the axis of said slabline;

and wherein the output port of said harmonic tuner is connected into port 1 of a circulator operating in the frequency range of said input signal;

and wherein the signal from the second channel of said signal source is injected into port 3 of said circulator and port 2 of said circulator is terminated using the characteristic impedance;

said signal flow in said circulator is from port 1 to port 2, from port 2 to port 3 and from port 3 to port 1.

2. A test setup as in claim 1, wherein said harmonic tuner comprises three independent probes (slugs).

3. A test setup as in claim 1, wherein said harmonic tuner comprises four independent probes (slugs).

4. A test setup as in claim 1, wherein said harmonic tuner is replaced by a harmonic rejection tuner and a wideband tuner, cascaded in the direction of the signal flow, wherein the input port of said harmonic rejection tuner is connected to the output port of said DUT and the output port of said harmonic rejection tuner is connected to the input port of said wideband tuner;

and wherein said harmonic rejection tuner comprises an input port and an output port and a slotted airline (slabline) connecting said ports; and at least one set of shunt harmonic resonators, remotely movable along the axis of said slabline; each set of resonators comprising a pair of coaxial harmonic resonators each and each said harmonic resonator comprising a cavity and a center conductor; the walls of said cavity making sliding ground contact with the walls of said slabline;

and wherein said center conductor of said resonator is open at one end and makes sliding galvanic contact with the top of the center conductor of said slabline; said center conductor of each said resonator having an approximate length of one quarter of a wavelength at a harmonic frequency;

and wherein said wideband tuner has an input port and an output port and a slotted airline (slabline) connecting said ports and at least one metallic probe (slug) capacitively coupled to the center conductor of said slabline, said probe being insertable into said slabline and moveable by remote control vertically approaching said center conductor of said slabline and horizontally parallel to the axis of said slabline;

and wherein the output port of said wideband tuner is connected to port 1 of said circulator.

5. A test setup as in claim 1, wherein an attenuator is inserted between the output port of said harmonic tuner and port 1 of said circulator.

6. A test setup as in claim 5, wherein said attenuator has typical attenuation between 2 and 4 dB.

7. A test setup as in claim 1, wherein said harmonic tuner is replaced by a cascade of two wideband tuners, each said wideband tuner having an input port and an output port and a slotted airline (slabline) connecting said ports and at least one metallic probe (slug) capacitively coupled to the center conductor of said slabline, said probe being insertable into said slabline and moveable by remote control vertically approaching said center conductor of said slabline and horizontally parallel to the axis of said slabline.

8. A test setup as in claim 7, wherein said cascade of two wideband tuners is replaced by a cascade of three wideband tuners.

9. An active injection harmonic load pull test setup for reduced injected power comprises at least four coherent signal sources independently adjustable in amplitude and phase, wherein source 1 and source 2 generate a signal at a fundamental frequency (fo) and sources 3 and 4 generate a signal at the second and third harmonic frequencies 2fo and 3fo correspondingly;

and a device under test (DUT), a signal sampler, a source tuner and a load multi-probe harmonic tuner, a directional coupler, a power amplifier, a power combiner, a microwave load and a signal receiver;

wherein the signal from said source 1 is injected through the source tuner into the input port of said DUT and the signal exiting from the output port of the DUT is injected into the input port of said signal sampler;

said signal sampler being a four-port RF component, having an input and an output port and two coupled ports which sample, in a contactless manner, a small portion of the forward and backward travelling signal power waves between said input and output ports;

said signal sampler being operational at least over the frequency range between a fundamental frequency (fo) and the third harmonic frequency (3fo);

and wherein a small portion of the signal is sampled by said signal sampler and injected into said signal receiver;

and wherein the remaining signal at the output of said signal sampler is injected into the input port of said harmonic tuner;

said harmonic tuner having an input port and an output port and a slotted airline (slabline) connecting said ports and two or more metallic probes (slugs) capacitively coupled to the center conductor of said slabline, said probes being insertable into said slabline and moveable by remote control vertically approaching said center conductor of said slabline and horizontally parallel to the axis of said slabline;

and wherein the output port of said harmonic tuner is connected to the output port of said directional coupler;

and wherein the signals from said sources 2, 3 and 4 are injected into the input ports of a signal combiner;

and wherein the combined signals at the output port of said combiner are injected into the input port of a power amplifier;

and wherein the signal from the output port of said amplifier is injected into the coupled port of said directional coupler, coupled in direction of the output port of said harmonic tuner;

and wherein the signal extracted from the output port of said directional coupler is injected into an RF load;

10. An active injection harmonic load pull test setup for reduced injected power comprises three coherent signal sources 1, 2 and 3, independently adjustable in amplitude and phase, a device under test (DUT), a pre-matching test fixture, a signal sampler, a source tuner and a load multi-probe harmonic tuner, a circulator, a power combiner, a microwave load and a signal receiver;

wherein said pre-matching test fixture has an input section and an output section, said output section comprising a lambda quarter long micro-strip section at the fundamental frequency (fo) with a characteristic impedance Zc<Zo, whereby Zo is a standard impedance, typically 50 Ohms; and wherein the signal from source 1, at a fundamental frequency (fo), is injected through the source tuner into the input port of said DUT;

and wherein the output port of said DUT is pre-matched using said a micro-strip test fixture and the signal exiting from said output port of said test fixture is injected into the input port of said signal sampler;

said signal sampler being a four-port RF component, having an input and an output port and two coupled ports which sample, in a contactless manner, a small portion of the forward and backward travelling signal power waves between said input and output ports;

said signal sampler being operational at least over the frequency range between the fundamental frequency (fo) and the second harmonic frequency (2*fo*);

and wherein a small portion of said signal is sampled by said signal sampler and injected into said signal receiver;

and wherein the remaining signal at the output of said signal sampler is injected into the input port of said harmonic tuner;

said harmonic tuner having an input port and an output port and a slotted airline (slabline) connecting said ports and two metallic probes capacitively coupled to the center conductor of said slabline, said probes being insertable into said slabline and moveable by remote control vertically approaching said center conductor of said slabline and horizontally parallel to the axis of said slabline;

and wherein the output port of said harmonic tuner is connected into port 2 of said circulator; said circulator being capable of operating in a frequency band including the fundamental frequency (fo) and the second harmonic (2*fo*);

and wherein the signals from sources 2 (at fo) and 3 (at 2*fo*), are combined through said power combiner and the combined signals are injected into port 3 of said circulator and the signal extracted from port 2 of said circulator is injected into an RF load;

said signal flow in said circulator is from port 1 to port 2, from port 2 to port 3 and from port 3 to port 1.

11. A test setup as in claim 10, wherein said harmonic tuner is replaced by a cascade of two wideband tuners, each said wideband tuner having an input port and an output port and a slotted airline (slabline) between said ports and at least one metallic probe (slug) capacitively coupled to the center conductor of said slabline, said probe being insertable into said slabline and moveable by remote control vertically approaching said center conductor of said slabline and horizontally parallel to the axis of said slabline.

12. An active injection harmonic load pull test setup allowing reduced injected power comprises four coherent signal sources 1, 2, 3 and 4, independently adjustable in amplitude and phase, a device under test (DUT), a signal sampler, a source tuner and a load multi-probe harmonic tuner, a directional coupler, a circulator, a power combiner, a power amplifier (PA1) covering a fundamental frequency (fo) and the first harmonic frequency (2*fo*), a second power amplifier (PA2) covering the second harmonic frequency (3*fo*) and a microwave load;

and wherein the signal from source 1, at a fundamental frequency (fo), is injected through the source tuner into the input port of said DUT;

and wherein the signal exiting from the output port of said DUT is injected into the input port of said signal sampler and a small portion of it is extracted and injected into a signal receiver;

said signal sampler being a four-port RF component, having an input and an output port and two coupled ports which sample, in a contactless manner, a small portion of the forward and backward travelling signal power waves between said input and output ports;

said signal sampler being operational at least over the frequency range between the fundamental frequency (fo) and the second harmonic frequency (3*fo*);

and wherein the remaining signal at the output of said signal sampler is injected into the input port of said harmonic tuner;

said harmonic tuner having an input port and an output port and a slotted airline (slabline) between said ports and two metallic probes capacitively coupled to the center conductor of said slabline, said probes being insertable into said slabline and moveable by remote control vertically approaching said center conductor of said slabline and horizontally parallel to the axis of said slabline;

and wherein the output port of said harmonic tuner is connected into the input port of a directional coupler;

and wherein the output port of said directional coupler is connected to port 2 of a circulator, said circulator covering at least the frequency range between the fundamental frequency (fo) and the first harmonic frequency (2*fo*);

and wherein the coupled port of said directional coupler is connected to said power amplifier (PA2) and the power injected into said coupled port is coupled into the input port of said directional coupler; and wherein the signal from source 4, at the harmonic frequency (3*fo*), is injected into the input port of said power amplifier (PA2);

and wherein the signal from source 2 at the fundamental frequency (fo) and from source 3 at the first harmonic (2*fo*) are combined through a power combiner and the combined signals are injected into port 1 of said circulator and the signals extracted from port 2 of said circulator is injected into the output port of said coupler;

and whereby port 3 of said circulator is terminated with the characteristic impedance (Zo);

said signal flow in said circulator is from port 1 to port 2, from port 2 to port 3 and from port 3 to port 1.

13. A test setup as in claim 12, whereby said directional coupler has a coupling value between 6 and 10 dB.

14. A test setup as in claim 13, whereby an attenuator is inserted between the output port of said directional coupler and port 2 of said circulator.

15. A test setup as in claim 14, whereby said attenuator has a typical value between 3 and 6 dB.

16. An active injection harmonic load pull test system allowing reduced injected power comprises four coherent signal sources 1, 2, 3 and 4, independently adjustable in amplitude and phase, a device under test (DUT), a signal sampler, a source tuner and a load multi-probe harmonic tuner, a directional coupler, a circulator, a power combiner, a first power amplifier (PA1) covering a fundamental frequency (fo) and a second power amplifier (PA2) covering the second harmonic frequency (2*fo*) and the third harmonic frequency (3*fo*), a microwave load and a signal receiver;

and wherein the signal from source 1, at a fundamental frequency (fo), is injected through the source tuner into the input port of said DUT;

and wherein the signal exiting from the output port of said DUT is injected into the input port of said signal sampler and a small portion of it is extracted from coupled ports of said signal sampler and injected into said signal receiver;

said signal sampler being a four-port RF component, having an input and an output port and two coupled ports which sample, in a contactless manner, a small portion of the forward and backward travelling signal power waves between said input and output ports;

said signal sampler covering at least the frequency range between the fundamental frequency (fo) and the third harmonic frequency (3fo);

and wherein the remaining signal at the output of said signal sampler is injected into the input port of said harmonic tuner;

said harmonic tuner having an input port and an output port and a slotted airline (slabline) between said ports and three metallic probes capacitively coupled to the center conductor of said slabline, said probes being insertable into said slabline and moveable by remote control vertically approaching said center conductor of said slabline and horizontally parallel to the axis of said slabline;

and wherein the output port of said harmonic tuner is connected into the input port of a directional coupler;

and wherein the output port of said directional coupler is connected to port 2 of a circulator, said circulator covering the fundamental frequency (fo);

and wherein port 1 of said circulator is terminated with the characteristic impedance (Zo);

and wherein the signals from sources 3 (at 2fo) and 4 (at 3fo) are combined using a power combiner and the combined signal is injected into the input port of a power amplifier (PA2) covering the frequency range 2fo to 3fo;

and whereby the output port of said second amplifier (PA2) is connected to the coupled port of said directional coupler;

and wherein the signal from source 2 at the fundamental frequency (fo) is injected into the input port of said first power amplifier (PA1) and the extracted signal from the output port of said amplifier (PA1) is injected into port 1 of said circulator and the signal extracted from port 2 of said circulator is injected into the output port of said coupler;

and whereby port 3 of said circulator is terminated with the characteristic impedance (Zo);

said signal flow in said circulator is from port 1 to port 2, from port 2 to port 3 and from port 3 to port 1.

17. A test system as in claim 16, whereby said directional coupler has a coupling value between 6 and 10 dB.

* * * * *